United States Patent
Shi

(10) Patent No.: US 9,723,725 B2
(45) Date of Patent: Aug. 1, 2017

(54) RIGID-FLEXIBLE CIRCUIT INTERCONNECTS

(71) Applicant: FINISAR CORPORATION, Sunnyvale, CA (US)

(72) Inventor: Wei Shi, San Jose, CA (US)

(73) Assignee: FINISAR CORPORATION, Sunnyvale, CA (US)

(*) Notice: Subject to any disclaimer, the term of this patent is extended or adjusted under 35 U.S.C. 154(b) by 295 days.

(21) Appl. No.: 14/289,249

(22) Filed: May 28, 2014

(65) Prior Publication Data

US 2014/0355228 A1 Dec. 4, 2014

Related U.S. Application Data

(60) Provisional application No. 61/828,312, filed on May 29, 2013.

(51) Int. Cl.
*H05K 1/11* (2006.01)
*H05K 1/02* (2006.01)
(Continued)

(52) U.S. Cl.
CPC .............. *H05K 3/363* (2013.01); *H05K 3/36* (2013.01); *H01L 23/49822* (2013.01);
(Continued)

(58) Field of Classification Search
CPC ................. H05K 1/118; H05K 1/0298; H05K 2201/042; H05K 2201/1568;
(Continued)

(56) References Cited

U.S. PATENT DOCUMENTS 5,220,200 A * 6/1993 Blanton .................. H01L 24/81
257/778
5,591,941 A * 1/1997 Acocella .............. B23K 1/0008
174/261

(Continued)

FOREIGN PATENT DOCUMENTS

JP 2001-257445 A 9/2001
JP 2001250909 9/2001
(Continued)

OTHER PUBLICATIONS

International Search Report and Written Opinion mailed Sep. 17, 2014 as received in PCT Application No. PCT/US2014/040056.

*Primary Examiner* — Nathan Milakovich
(74) *Attorney, Agent, or Firm* — Maschoff Brennan

(57) ABSTRACT

In an example embodiment, a circuit interconnect includes a first printed circuit board (PCB), a second PCB, a spacer, and an electrically conductive solder joint. The first PCB includes a first electrically conductive pad. The second PCB includes a second electrically conductive pad. The spacer is configured to position the first PCB relative to the second PCB such that a space remains between the first PCB and the second PCB after the first electrically conductive pad and the second electrically conductive pad are conductively connected in a soldering process. The electrically conductive solder joint conductively connects the first electrically conductive pad and the second electrically conductive pad.

11 Claims, 8 Drawing Sheets

(51) Int. Cl.
*H05K 3/36* (2006.01)
*H01L 23/498* (2006.01)

(52) U.S. Cl.
CPC .. *H01L 23/49833* (2013.01); *H01L 23/49838* (2013.01); *H01L 23/49855* (2013.01); *H01L 2924/0002* (2013.01); *H05K 2201/0367* (2013.01); *H05K 2201/099* (2013.01); *H05K 2201/09445* (2013.01); *H05K 2201/09781* (2013.01); *H05K 2201/2036* (2013.01)

(58) Field of Classification Search
CPC ... H05K 2201/2036; H05K 2201/0182; H05K 3/36; H05K 3/363
See application file for complete search history.

(56) References Cited

U.S. PATENT DOCUMENTS

| | | | | |
|---|---|---|---|---|
| 5,896,276 A * | 4/1999 | Tamura | ............... | H01L 21/563 174/263 |
| 6,296,494 B1 * | 10/2001 | Yuasa | ................... | H05K 1/141 361/789 |
| 6,429,380 B1 * | 8/2002 | Lee | ....................... | H02G 5/025 174/138 G |
| 6,564,450 B2 * | 5/2003 | Engbring | ............... | H05K 3/368 174/255 |
| 6,678,167 B1 * | 1/2004 | Degani | .................. | H01L 23/36 257/E23.101 |
| 6,786,737 B2 * | 9/2004 | Tai | ........................... | H05K 3/20 29/848 |
| 6,880,245 B2 * | 4/2005 | Beaman | ............ | G01R 1/06711 29/426.1 |
| 7,191,515 B2 * | 3/2007 | Sundahl | .............. | H05K 3/4614 228/180.21 |
| 7,448,923 B2 * | 11/2008 | Uka | ...................... | H01R 4/024 174/88 R |
| 7,656,673 B1 * | 2/2010 | Fries | ..................... | H05K 1/189 361/744 |
| 7,785,113 B2 * | 8/2010 | Mizoguchi | ............ | H01R 12/58 439/67 |
| 8,089,774 B2 * | 1/2012 | Choi | ........................ | G11C 5/04 174/254 |
| 8,721,349 B2 * | 5/2014 | Yagisawa | ............. | G02B 6/4246 439/67 |
| 8,749,072 B2 * | 6/2014 | Zhao | .................... | H01L 25/0657 257/686 |
| 8,754,332 B2 * | 6/2014 | Sumida | ............... | G02F 1/13452 174/254 |
| 2001/0053068 A1 * | 12/2001 | Murayama | ............ | H05K 1/144 361/760 |
| 2002/0109213 A1 * | 8/2002 | Kovac | .................... | H01L 21/56 257/668 |
| 2007/0119911 A1 * | 5/2007 | Chan | ..................... | H05K 3/303 228/180.22 |
| 2007/0273045 A1 | 11/2007 | Kitada et al. | | |
| 2008/0224309 A1 * | 9/2008 | Hori | ........................ | H01L 24/81 257/737 |
| 2009/0085227 A1 * | 4/2009 | Shiraishi | ................ | H05K 3/303 257/778 |
| 2009/0250507 A1 | 10/2009 | Huang et al. | | |
| 2010/0129083 A1 * | 5/2010 | Mu | ....................... | G02B 6/4201 398/135 |
| 2011/0084375 A1 * | 4/2011 | Eu | .......................... | H05K 1/141 257/690 |
| 2011/0134614 A1 * | 6/2011 | Berger | ................ | G02B 6/4201 361/749 |
| 2012/0024593 A1 * | 2/2012 | Watanabe | ............. | H05K 1/141 174/520 |
| 2016/0029503 A1 * | 1/2016 | Shedletsky | ........... | H05K 1/147 361/679.02 |
| 2016/0113107 A1 * | 4/2016 | Wang | .................... | H01L 24/00 361/783 |

FOREIGN PATENT DOCUMENTS

| | | |
|---|---|---|
| JP | 2001257445 A * | 9/2001 |
| JP | 2004127612 | 4/2004 |
| JP | 2007317851 | 12/2007 |
| JP | 2012151487 | 8/2012 |

* cited by examiner

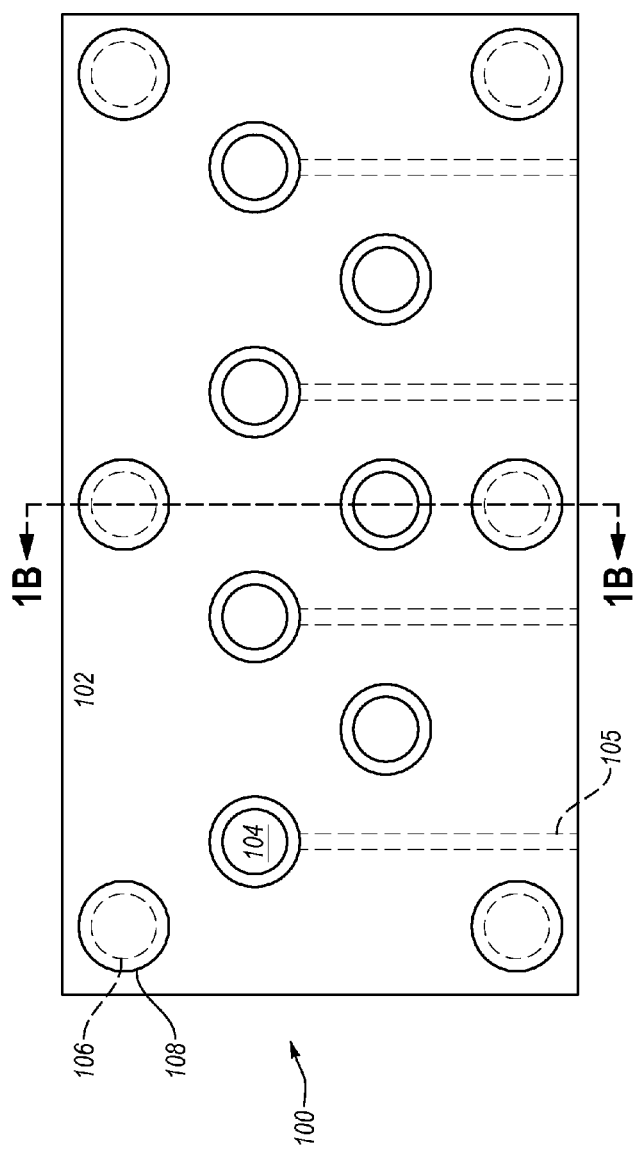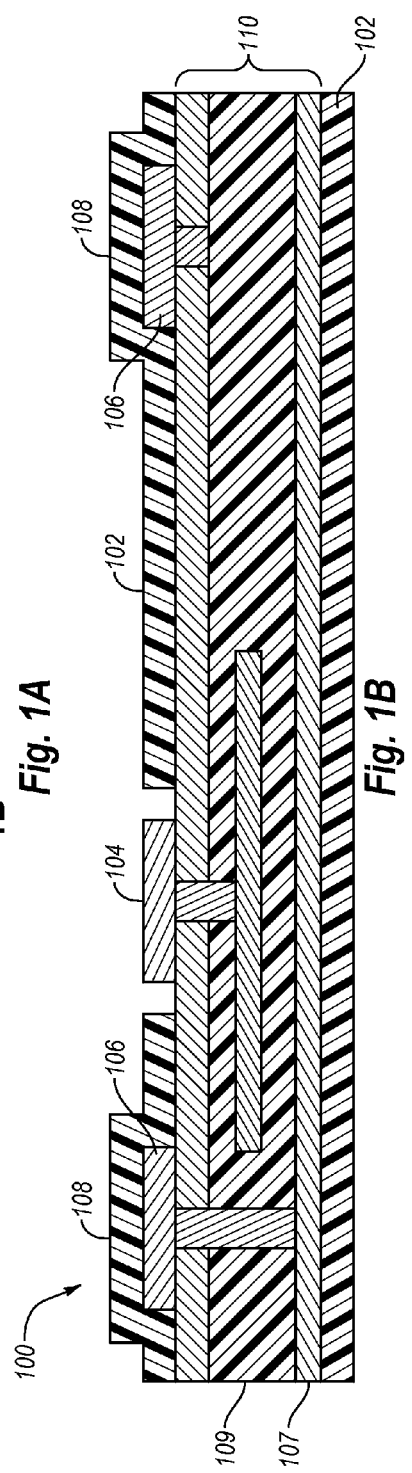

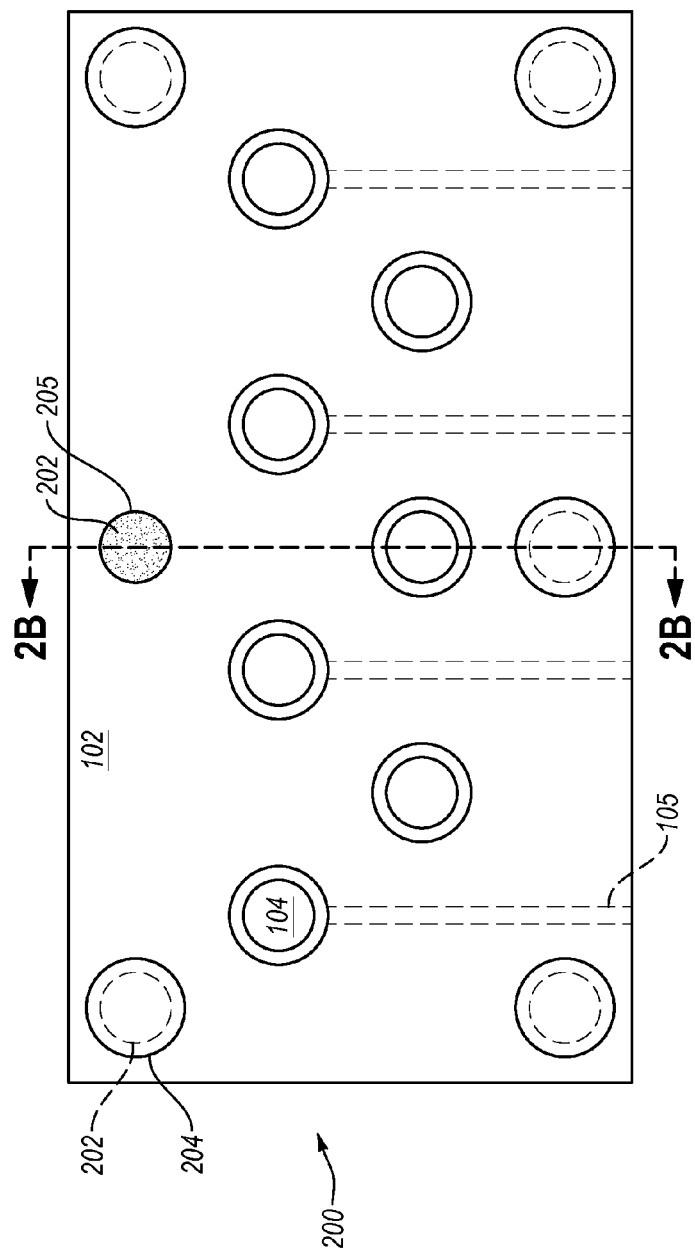
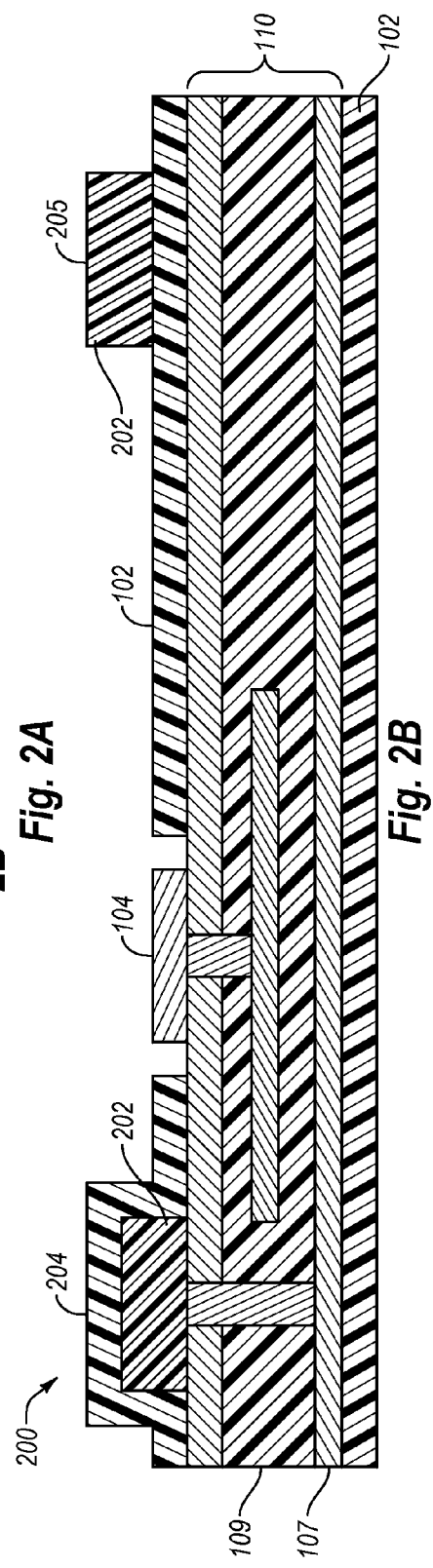
Fig. 2A
Fig. 2B

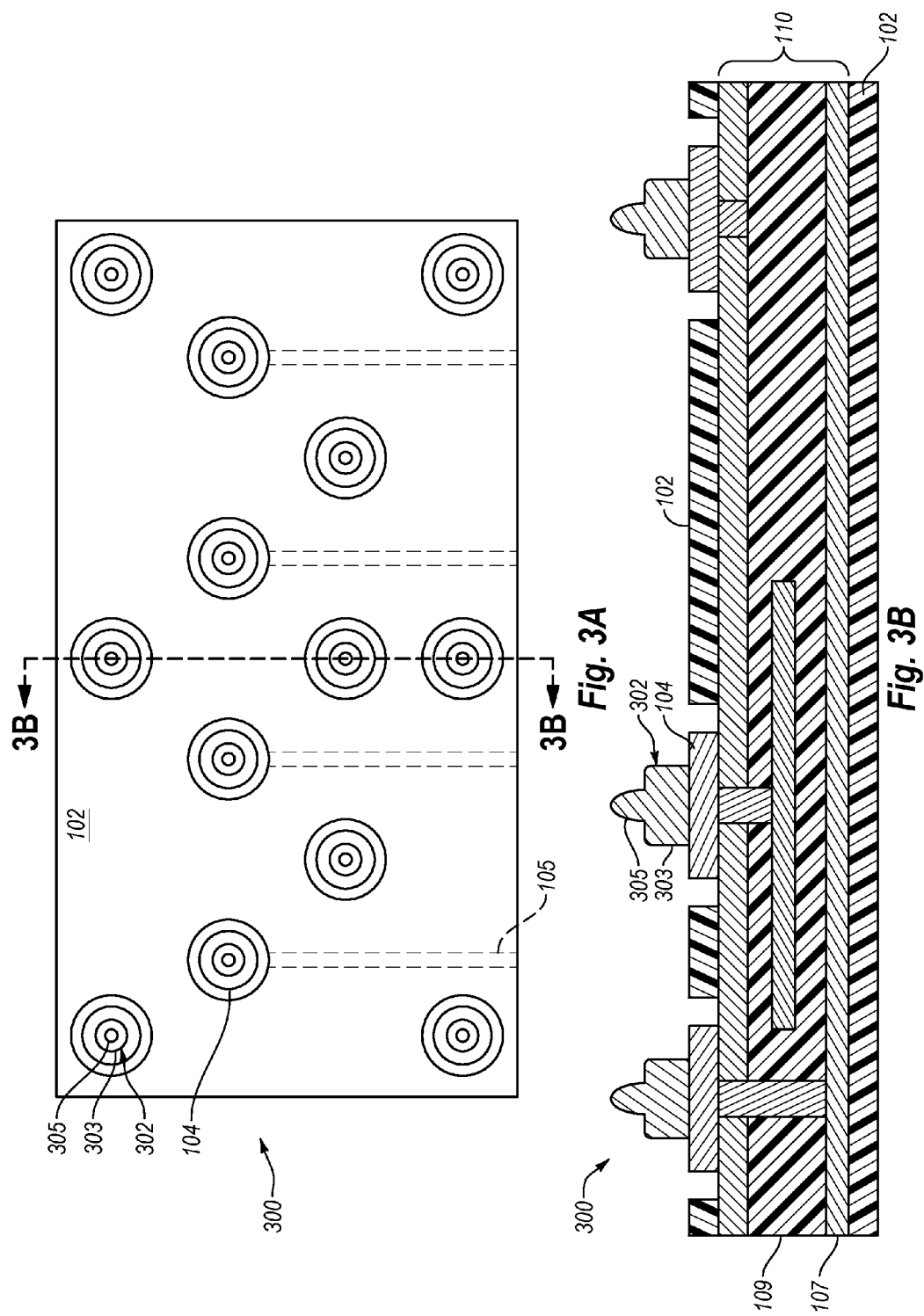

RIGID-FLEXIBLE CIRCUIT INTERCONNECTS

CROSS-REFERENCE TO RELATED APPLICATIONS

This patent application claims priority to U.S. Provisional Application No. 61/828,312, titled RIGID-FLEXIBLE CIRCUIT INTERCONNECTS, filed May 29, 2013, which is incorporated herein by reference in its entirety.

FIELD

The embodiments discussed herein relate to interconnects between printed circuit boards (PCBs). More particularly, embodiments may relate to interconnects between rigid PCBs and flexible PCBs in rigid-flex PCBs with fine-pitch bonding.

SUMMARY

This Summary introduces a selection of concepts in a simplified form that are further described below in the Detailed Description. This Summary is not intended to identify key features or essential characteristics of the claimed subject matter, nor is it intended to be used as an aid in determining the scope of the claimed subject matter.

In an example embodiment, a circuit interconnect includes a first printed PCB, a second PCB, a spacer, and an electrically conductive solder joint. The first PCB includes a first electrically conductive pad. The second PCB includes a second electrically conductive pad. The spacer is configured to position the first PCB relative to the second PCB such that a space remains between the first PCB and the second PCB after the first electrically conductive pad and the second electrically conductive pad are conductively connected in a soldering process. The electrically conductive solder joint conductively connects the first electrically conductive pad and the second electrically conductive pad.

In another example embodiment, a rigid-flex circuit includes a rigid-flex interconnect. The rigid-flex interconnect includes a flexible PCB, a rigid PCB, multiple electrically conductive solder joints. The flexible PCB includes a first multiple electrically conductive pads. The flexible PCB also includes a first multiple electrically conductive plates covered by a first dielectric layer such that a first multiple spacers are formed on the flexible PCB. The rigid PCB includes a second multiple electrically conductive pads. The rigid PCB also includes a second multiple electrically conductive plates covered by a second dielectric layer such that a second multiple spacers are formed on the rigid PCB. The multiple electrically conductive solder joints conductively connect the first multiple electrically conductive pads and the second multiple electrically conductive pads. The first multiple spacers are positioned to abut the second multiple spacers as the first multiple electrically conductive pads and the second multiple electrically conductive pads are conductively connected during a soldering process such that a space remains between the flexible PCB and the rigid PCB after the first multiple electrically conductive pads and the second multiple electrically conductive pads are conductively connected as a result of the soldering process.

In another example embodiment, a circuit interconnect includes a first PCB, as second PCB, and a solder layer. The first PCB includes a first substrate and a first conductive trace positioned on the first substrate such that a first end of the first conductive trace is set back from a first adjacent edge of the first substrate. The second PCB includes a second substrate and a second conductive trace positioned on the second substrate such that a second end of the second conductive trace is set back from a second adjacent edge of the second substrate. The solder layer conductively connects the first end of the first conductive trace and the second end of the second conductive trace such that a space remains between the first substrate and the second conductive trace after a soldering process.

Additional features and advantages will be set forth in the description which follows, and in part will be obvious from the description, or may be learned by the practice of the embodiments. The features and advantages of the embodiments will be realized and obtained by means of the instruments and combinations particularly pointed out in the claims. These and other features will become more fully apparent from the following description and claims, or may be learned by the practice of the embodiments as set forth hereinafter.

BRIEF DESCRIPTION OF THE DRAWINGS

A particular description of the invention will be rendered by reference to specific embodiments thereof which are illustrated in the appended drawings. It is appreciated that these drawings depict only typical embodiments of the invention and are, therefore, not to be considered limiting of its scope. The invention will be described and explained with additional specificity and detail through the use of the accompanying drawings in which:

FIG. 1A is a top view of an example printed circuit board (PCB);

FIG. 1B is a side cross-sectional view of the PCB of FIG. 1A;

FIG. 2A is a top view of another example PCB;

FIG. 2B is a side cross-sectional view of the PCB of FIG. 2A;

FIG. 3A is a top view of another example PCB;

FIG. 3B is a side cross-sectional view of the PCB of FIG. 3A;

DESCRIPTION OF EMBODIMENTS

Figure 1C:
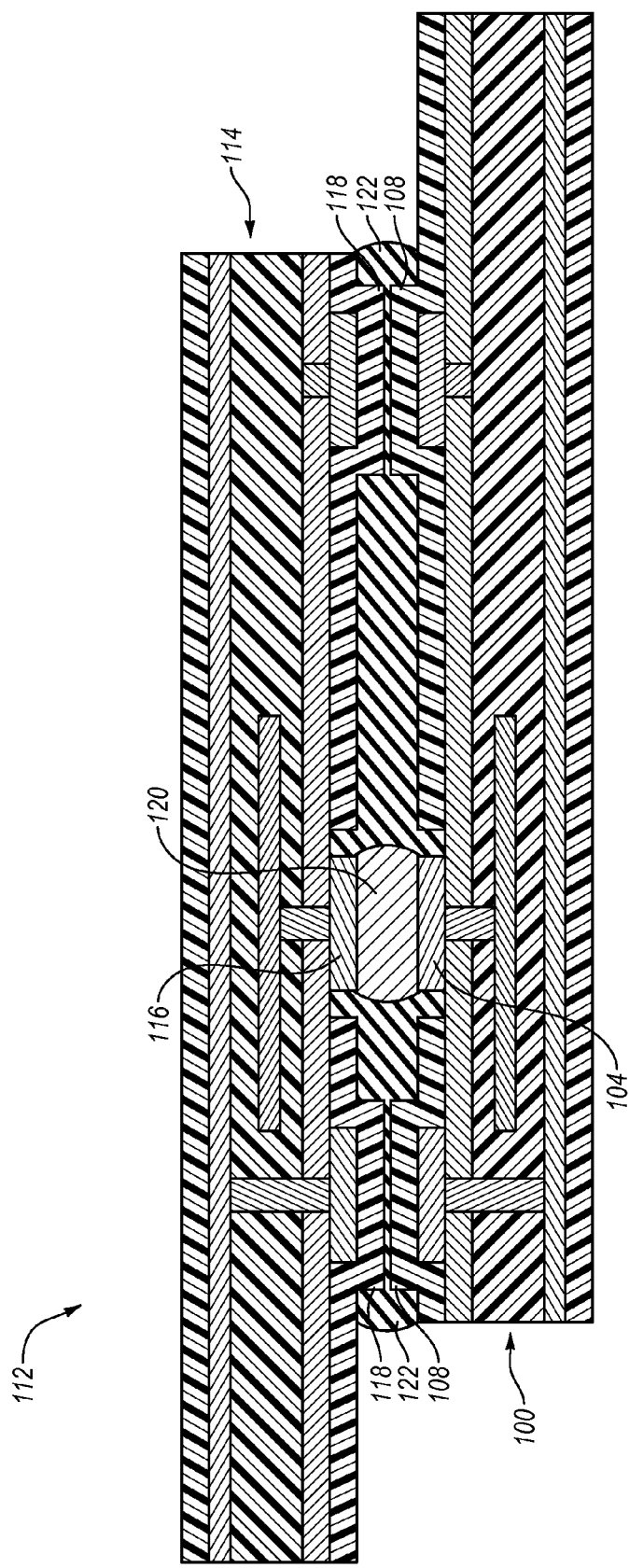
FIG. 1C is a side cross-sectional view of an example interconnect including the PCB of FIG. 1A.

Printed circuit boards (PCBs) may include both rigid and flexible sections. Such PCBs are commonly described as "rigid-flex" PCBs or rigid-flex circuits. Rigid-flex PCBs may be formed by conductively bonding electrically conductive pads of a flexible PCB to electrically conductive pads of a rigid PCB.

Conventional rigid-flex PCBs may include a dielectric support to further non-conductively bond the flexible PCB to the rigid PCB at the interface of the flexible PCB and the rigid PCB. The dielectric support may provide mechanical support to the electrically conductive bonds between the flexible PCB and the rigid PCB.

Some applications may employ fine-pitch conductive pads on the flexible PCB and/or the rigid PCB. Conventional fine-pitch bonding processes, such as thermal compression bonding, may result in a connection between a rigid PCB and a flexible PCB (described herein as a rigid-flex interconnect) that does not allow dielectric support to be introduced to the rigid PCB and flexible PCB interface. A lack of dielectric support may leave circuits employing such rigid-flex interconnects susceptible to mechanically-induced failure.

Employing anisotropic conductive film (ACF) to perform fine-pitch bonding may improve the mechanical support of the resulting rigid-flex interconnects. However, ACF may experience a skin effect, e.g., current crowding, on electrically conductive particles within the ACF, particularly when a high-speed signal passes through the ACF. Use of ACF may also introduce parasitic capacitance to the circuit when dielectric epoxy of the ACF is sandwiched between the conductive pads of the flexible PCB and the conductive pads of the rigid PCB. Furthermore, the ACF may introduce inductance to a circuit that is difficult to calculate.

Additionally, conduction mechanisms for contact resistance of ACF bonds may be complicated and poorly understood. In some instances, the contact resistance may be impacted by factors such as the nature of the contact surface of the bond, thermal stresses in the bond, the degree of bond deformation, and the like. Furthermore, impedance of an ACF bond may be sensitive to pressure. Additionally, the quality of an ACF bond may be difficult to control during production.

Embodiments may relate to rigid-flex interconnects that allow fine-pitch, soldered, metallurgical, electrically conductive connections between a rigid PCB and a flexible PCB while maintaining a space between the rigid PCB and the flexible PCB such that a dielectric support may be introduced to the rigid-flex interconnect.

Reference will now be made to the figures wherein like structures will be provided with like reference designations. The drawings are diagrammatic and schematic representations of exemplary embodiments and, accordingly, are not limiting of the scope of the claimed subject matter, nor are the drawings necessarily drawn to scale.

FIG. 1A is a top view of an example PCB 100. FIG. 1B is a side cross-sectional view of the PCB 100. The PCB 100 may be a rigid PCB or a flexible PCB.

With combined reference to FIGS. 1A and 1B, the PCB 100 includes circuitry layers 110 (FIG. 1B) that may include electrically conductive traces 105 (FIG. 1A), electrically conductive ground layers 107 (FIG. 1B), a substrate 109 (FIG. 1B), and the like. The circuitry layers 110 may be conductively connected to one or more electrically conductive pads 104. The pads 104 may allow the PCB 100 to be conductively connected to other circuitry. Particularly, in some instances the pads 104 may allow the PCB 100 to be conductively connected to another PCB.

The pads 104 may be fine-pitch pads. For example, the pads 104 may have a diameter of about or less than 0.28 millimeters (mm) and may have a pitch, e.g., a center-to-center distance between adjacent pads 104, of about or less than 0.7 mm. However, embodiments described herein may be used with pads 104 having other diameters and/or pitches greater than, respectively, 0.28 mm and/or 0.7 mm.

The PCB 100 includes one or more plates 106. The plates 106 may be formed from an electrically conductive material and may be conductively connected to the circuitry layers 110 like the pads 104. Accordingly, the plates 106 may be formed with the same degrees of accuracy and precision and/or the same processes as the pads 104.

The PCB 100 includes dielectric layers 102. In some embodiments, the dielectric layers 102 may include a solder mask or polyimide coverlay.

The pads 104 are exposed by the dielectric layers 102 such that the pads 104 may form a conductive connection external to the PCB 100. In some embodiments, the pads 104 and the dielectric layers 102 may form non-solder mask defined (NSMD) pads 104.

In contrast, the plates 106 are covered by the dielectric layers 102 such that the plates 106 may not form conductive connections external to the PCB 100. The plates 106 and the dielectric layers 102 covering the plates 106 form one or more protrusions on the PCB 100 described herein as spacers 108.

FIG. 1C is a side cross-sectional view of an example interconnect 112 including the PCB 100. The interconnect 112 also includes a second PCB 114. The PCB 114 may generally correspond to the PCB 100. If the PCB 100 is a rigid PCB, the PCB 114 may be a flexible PCB. If the PCB 100 is a flexible PCB, the PCB 114 may be a rigid PCB. In some embodiments, the PCB 100 and the PCB 114 may both be flexible PCBs or may both be rigid PCBs.

The PCB 114 includes one or more electrically conductive pads 116 generally corresponding to the pads 104 of the PCB 100. Furthermore, the PCB 114 includes one or more spacers 118 generally corresponding to the spacers 108 of the PCB 100.

The PCB 100 and the PCB 114 may be configured such that the pads 104 of the PCB 100 may be at least partially aligned with and soldered to the pads 116 of the PCB 114. The pads 104 may by soldered, e.g., conductively connected, to the pads 116 by a solder joint 120.

In some embodiments, the pads 104 may be soldered to the pads 116 via ball grid array (BGA) solder balls attached to the pads 104 and/or pads 116. Alternately or additionally, the pads 104 and/or pads 116 may be pre-tinned with solder. Any suitable solder may be used, including solder having tin, silver, copper, indium, bismuth, gold, and/or other suitable elements.

The soldering process may include thermal compression bonding, hot bar bonding, or the like. The PCB 100 and the PCB 114 may be aligned and forced together at a suitable force and with suitable heat such that solder applied to the pads 104 and/or pads 116 melts and conductively connects each of the pads 104 to a corresponding one of the pads 116. After the pads 104 and the pads 116 are conductively connected by the melted solder, the heat may be removed such that the solder solidifies to form the solder joint 120.

The PCB 100 and the PCB 114 may be configured such that the spacers 108 at least partially abut the spacers 118 while the pads 104 and the pads 116 are soldered together in the soldering process. While the PCB 100 and the PCB 114 are forced together and the solder is melted, the spacers 108 and the spacers 118 abut and position the PCB 100 relative to the PCB 114 such that a space remains between the PCB 100 and the PCB 114 at the interconnect 112. In the illustrated embodiment, the spacers 108 and the spacers 118 each have a height approximately equivalent to one-half the height of the space remaining between the PCB 100 and the PCB 114. In some forms, the spacers 108 and the spacers 118 may have different heights that make up different portions of the height of the space remaining between the PCB 100 and the PCB 114.

The resulting space may be filled with a dielectric support 122. The dielectric support 122 may include underfill, liquid crystal polymer (LCP), epoxy, and the like. The dielectric support 122 may be introduced to the space between the PCB 100 and the PCB 114 through a capillary process. The dielectric support 122 may add mechanical support to the interconnect 112.

FIG. 2A is a top view of another example PCB 200. FIG. 2B is a side cross-sectional view of the PCB 200. The PCB 200 may be a rigid PCB or a flexible PCB. The PCB 200 includes some elements that are similar or identical to elements of the PCB 100 of FIGS. 1A-1C, such as the dielectric layers 102, the pads 104, the conductive traces 105, the conductive ground layers 107, the substrate 109, and the circuitry layers 110, for which a more detailed description is already provided above.

With combined reference to FIGS. 2A and 2B, the PCB 200 includes plates 202. The plates 202 may include a dielectric material such as LCP. In some embodiments, the plates 202 may include a conductive feature (not shown) such as an electrically conductive plate similar to or the same as the plates 106 of FIGS. 1A-1C covered with a dielectric material such as LCP.

The dielectric layers 102 and the plates 202 may form one or more protrusions on the PCB 200 described herein as spacers 204 and/or spacers 205.

In some embodiments, the spacers 205 may be created by forming the plates 202 atop the dielectric layers 102. Alternately or additionally, the spacers 204 may be created by forming the plates 202 on the circuitry layers 110 and covering the plates 202 with the dielectric layers 102.

Figure 2C:
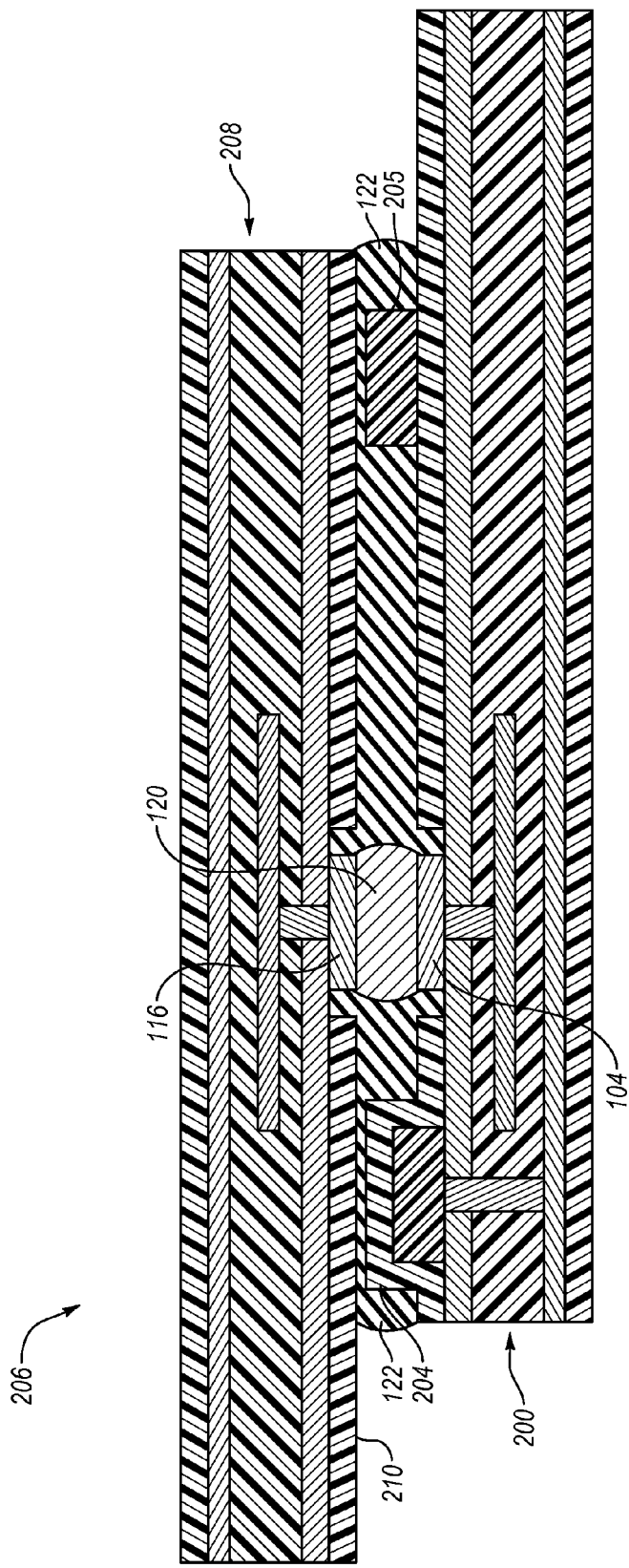
FIG. 2C is a side cross-sectional view of an example interconnect including the PCB of FIG. 2A.

FIG. 2C is a side cross-sectional view of an example interconnect 206 including the PCB 200. The interconnect 206 includes some elements that are similar or identical to elements of the interconnect 112 of FIG. 1C, such as the dielectric support 122, for which a more detailed description is already provided above.

The interconnect 206 also includes a second PCB 208. If the PCB 200 is a rigid PCB, the PCB 208 may be a flexible PCB. If the PCB 200 is a flexible PCB, the PCB 208 may be a rigid PCB. In some embodiments, the PCB 200 and the PCB 208 may both be flexible PCBs or may both be rigid PCBs.

The interconnect 206 may be formed via a soldering process generally corresponding to the interconnect 112 described with reference to FIG. 1C.

While the PCB 200 and the PCB 208 are forced together and the solder is melted, the spacers 204 and/or the spacers 205 and a face 210 of the PCB 208 abut and position the PCB 200 relative to the PCB 208 such that a space remains between the PCB 200 and the PCB 208 at the interconnect 206. In some embodiments, the spacers 204 and/or the spacers 205 may have a height approximately equivalent to the height of the space remaining between the PCB 200 and the PCB 208.

Although the spacers 204 and the spacers 205 are illustrated as being located only on one PCB (e.g., the PCB 200), in some embodiments the spacers 204 and/or the spacers 205 may be located on both PCBs (e.g., the PCB 200 and the PCB 208). Alternately or additionally, the spacers 204 and/or the spacers 205 on one PCB may at least partially abut counterpart spacers (not shown) located on the other PCB in a manner analogous to the spacers 108 and the spacers 118 described with reference to FIG. 1C.

The resulting space may be filled with the dielectric support 122 in a manner generally corresponding to that described with reference to the interconnect 112 of FIG. 1C.

FIG. 3A is a top view of another example PCB 300. FIG. 3B is a side cross-sectional view of the PCB 300. The PCB 300 may be a rigid PCB or a flexible PCB. The PCB 300 includes some elements that are similar or identical to elements of the PCB 100 of FIGS. 1A-1C, such as the dielectric layers 102, the pads 104, the conductive traces 105, the conductive ground layers 107, the substrate 109, and the circuitry layers 110, for which a more detailed description is already provided above.

Electrically conductive studs 302 may be formed on the pads 104. In some embodiments, the conductive studs 302 may be formed from gold, copper, silver, or the like. The conductive studs 302 may include bases 303 and protrusions 305.

Figure 3C:
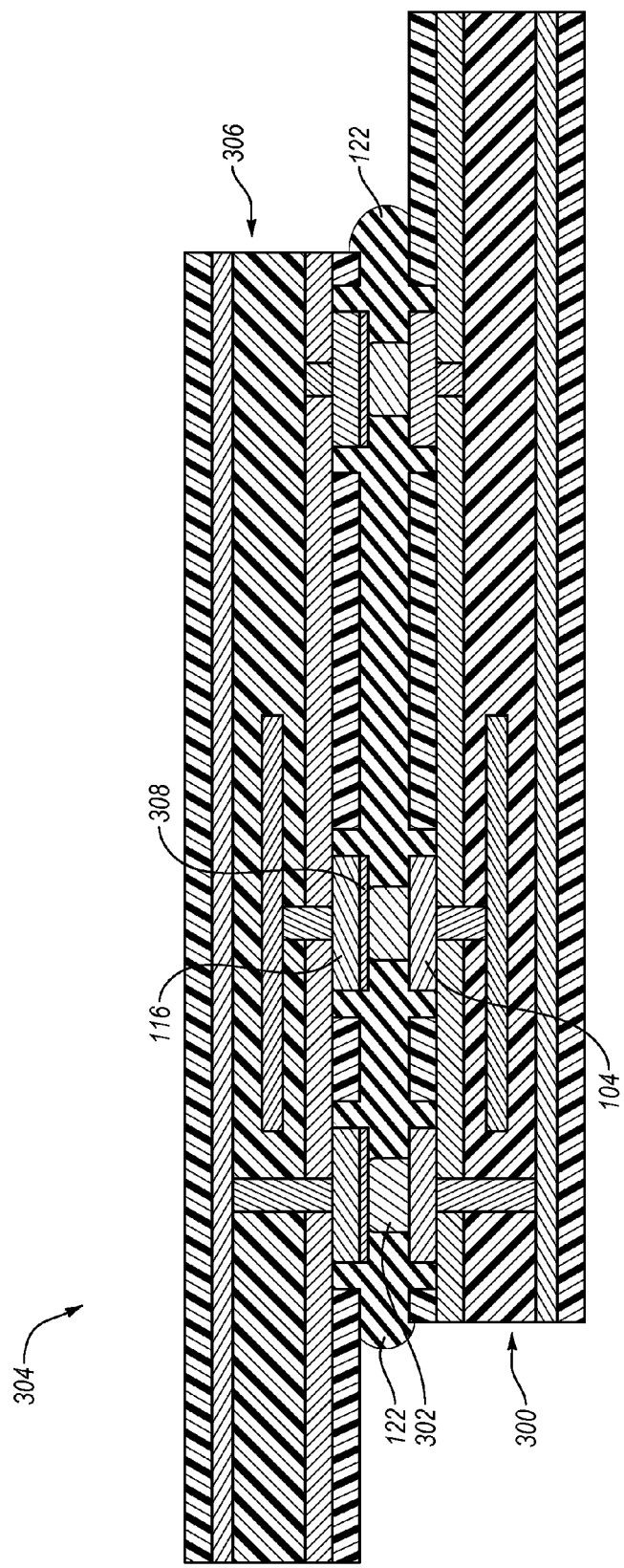
FIG. 3C is a side cross-sectional view of an example interconnect including the PCB of FIG. 3A.

FIG. 3C is a side cross-sectional view of an example interconnect 304 including the PCB 300. The interconnect 304 includes some elements that are similar or identical to elements of the interconnect 112 of FIG. 1C, such as the pads 116 and the dielectric support 122, for which a more detailed description is already provided above.

The interconnect 304 also includes a second PCB 306 including the pads 116 coated with solder 308. If the PCB 300 is a rigid PCB 300, the PCB 306 may be a flexible PCB 306. If the PCB 300 is a flexible PCB 300, the PCB 306 may be a rigid PCB 306. In some embodiments, the PCB 300 and the PCB 306 may both be flexible PCBs or may both be rigid PCBs.

The interconnect 304 may be formed via a soldering process such as thermal compression bonding, hot bar bonding, or the like. The PCB 300 and the PCB 306 may be aligned and forced together at a suitable force and with suitable heat such that the solder 308 applied to the pads 116 and the protrusions 305 of the conductive studs 302 at least partially melts and conductively connects each of the pads 104 to a corresponding one of the pads 116. After the pads 104 and the pads 116 are conductively connected by the melted solder 308 and/or the conductive studs 302, the heat may be removed such that the solder 308 and/or the conductive studs 302 solidify.

The conductive studs 302 maintain spacing between the PCB 300 and the PCB 306 as the PCB 300 and the PCB 306 are forced together under suitable heat. The conductive studs 302 may partially melt, soften, and/or deform during the soldering process such that the protrusion 305 is flattened, melted, and/or compressed into the base 303 and/or into the solder 308. The base 303, which may be larger than the protrusion 305, may sufficiently resist melting, softening, and/or deformation during the soldering process such that the base 303 functions as a spacer and positions the PCB 300 relative to the PCB 306 such that a space remains between the PCB 300 and the PCB 306 after the soldering process.

By way of example, the size of the base 303, the size of the protrusion 305, the proportions of the base 303 relative to the protrusion 305, the composition of the conductive studs 302, the heat applied during the soldering process, and/or the force applied during the soldering process may be varied to allow the base 303 to function as a spacer such that the interconnect 304 is formed with the space remaining between the PCB 300 and the PCB 306.

The resulting space may be filled with the dielectric support 122 in a manner generally corresponding to that described with reference to the interconnect 112 of FIG. 1C.

Figure 4A:
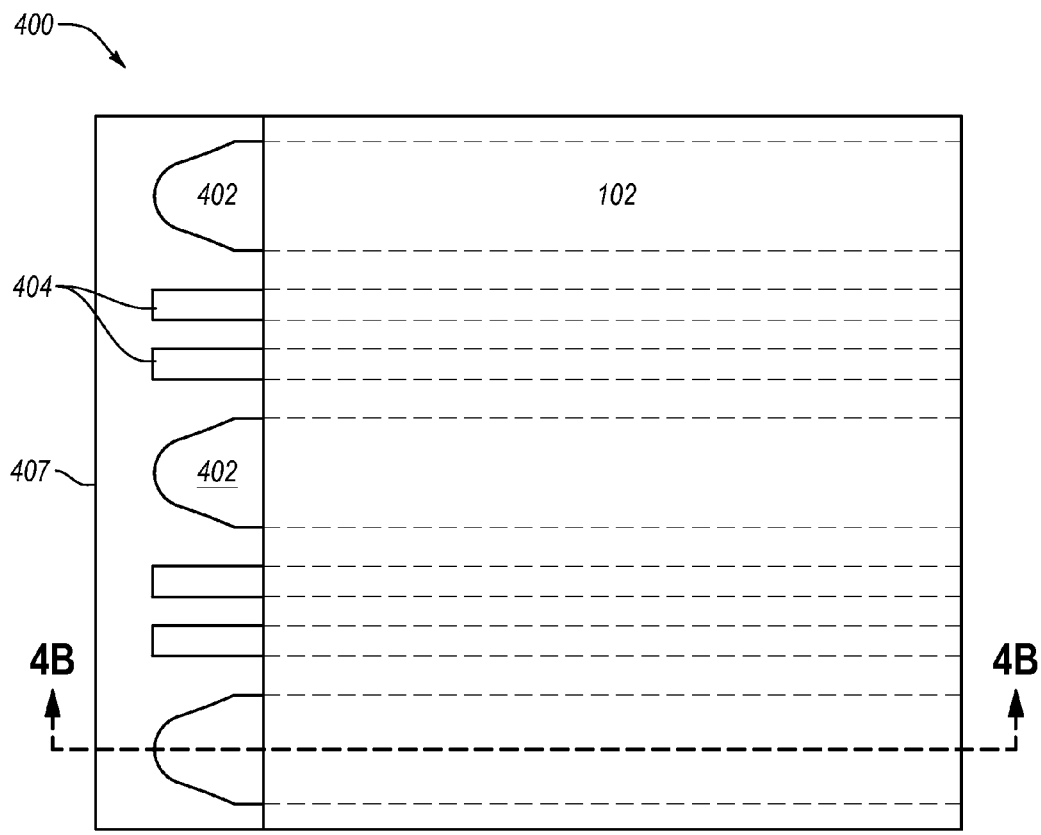
FIG. 4A is a top view of another example PCB.
Figure 4B:
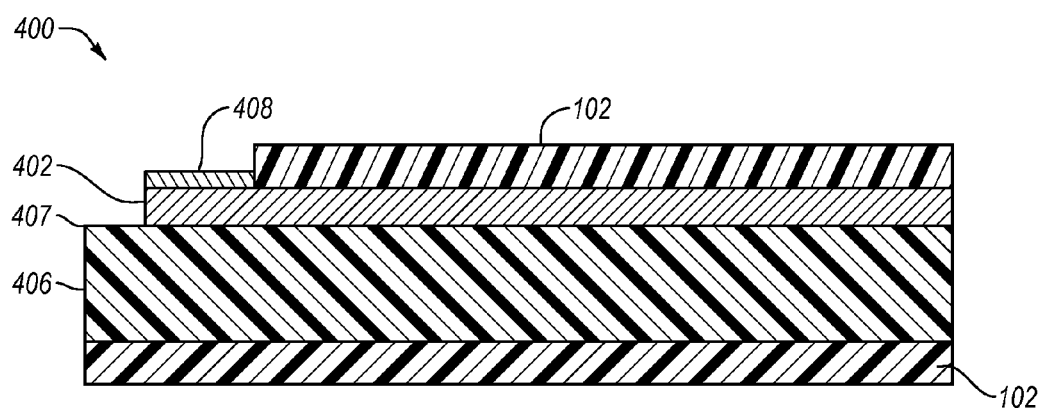
FIG. 4B is a side cross-sectional view of the PCB of FIG. 4A.

FIG. 4A is a top view of another example PCB 400. FIG. 4B is a side cross-sectional view of the PCB 400. The PCB 400 may be a rigid PCB or a flexible PCB. The PCB 400 includes some elements that are similar or identical to elements of the PCB 100 of FIGS. 1A-1C, such as dielectric layers 102, for which a description is already provided above.

With combined reference to FIGS. 4A and 4B, the PCB 400 may include ground traces 402 and signal traces 404. The ground traces 402 and the signal traces 404 may form coplanar waveguide transmission lines. Alternately or additionally, the PCB 400 may include other configurations of transmission lines. The ground traces 402 and the signal traces 404 may be formed on a substrate 406.

The dielectric layers 102 cover portions of the ground traces 402 and the signal traces 404 to leave the ends of the ground traces 402 and the signal traces 404 exposed. For example, in FIG. 4A, the covered portions of the ground traces 402 and the signal traces 404 are indicated by dashed lines, while the exposed ends of the ground traces 402 and the signal traces 404 are indicated by solid lines. The exposed ends of the ground traces 402 and the signal traces 404 may be set back from an adjacent edge 407 of the substrate 406. Solder layer 408 may be applied to the exposed ends of the ground traces 402 and the signal traces 404.

Figure 4C:
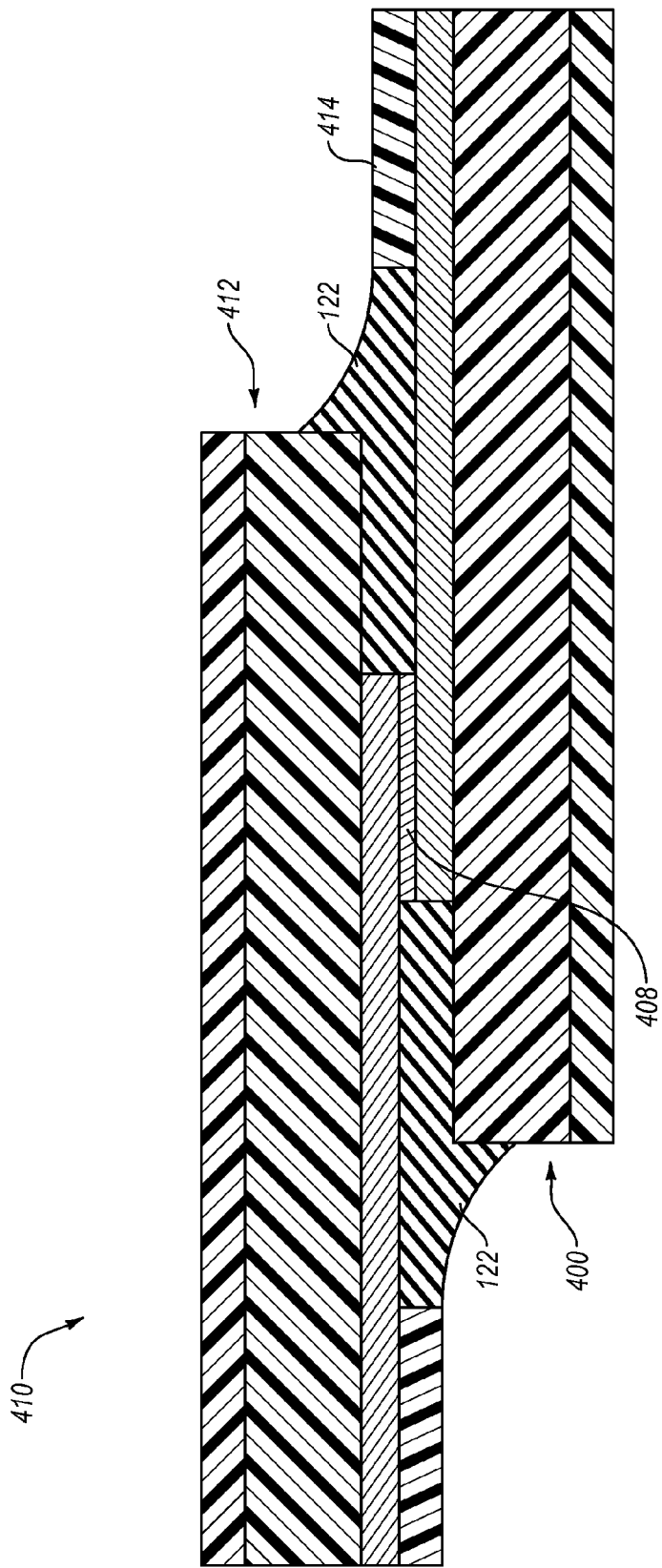
FIG. 4C is a side cross-sectional view of an example interconnect including the PCB of FIG. 4A.

FIG. 4C is a side cross-sectional view of an example interconnect 410 including the PCB 400. The interconnect 410 includes some elements that are similar or identical to elements of the interconnect 112 of FIG. 1C, such as the dielectric support 122, for which a more detailed description is already provided above.

The interconnect 410 also includes a second PCB 412. The PCB 412 may generally correspond to the PCB 400. If the PCB 400 is a rigid PCB, the PCB 412 may be a flexible PCB. If the PCB 400 is a flexible PCB, the PCB 412 may be a rigid PCB. In some embodiments, the PCB 400 and the PCB 412 may both be flexible PCBs or may both be rigid PCBs.

The interconnect 410 may be formed via a soldering process generally corresponding to the interconnect 112 disclosed with reference to FIG. 1C. When the PCB 400 and the PCB 412 have been soldered together, the size and the shape of the ground traces 402, the signal traces 404, and the solder layer 408 create a space between the PCB 400 and the PCB 412. The resulting space may be filled with the dielectric support 122 in a manner generally corresponding to that described with reference to the interconnect 112 of FIG. 1C.

In some embodiments, portions of the dielectric layers 102 shown in FIG. 4B may be removed to expose more of the ground traces 402 and signal traces 404, as disclosed in FIG. 4C. A remaining portion of the dielectric layers 102 may be referred to herein as dielectric layer 414. The dielectric layer 414 that remains may be positioned such that the interconnect 410 includes a space between the PCB 412 and the dielectric layer 414 such that dielectric support 122 may be introduced to the interconnect 410.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A circuit interconnect comprising:
   a first printed circuit board (PCB) including a first electrically conductive pad and a first spacer consisting of a first electrically conductive plate and a first dielectric layer located on the first electrically conductive plate;
   a second PCB including a second electrically conductive pad and a second spacer consisting of a second electrically conductive plate and a second dielectric layer located on the second electrically conductive plate;
   the first spacer and the second spacer configured to at least partially abut and to position the first PCB relative to the second PCB such that a space remains between the first PCB and the second PCB after the first electrically conductive pad and the second electrically conductive pad are conductively connected in a soldering process, wherein the first spacer and the second spacer each have a height equivalent to one-half the height of the space that remains between the first PCB and the second PCB; and
   an electrically conductive solder joint conductively connecting the first electrically conductive pad and the second electrically conductive pad.

2. The circuit interconnect of claim 1, further comprising a dielectric support located at least in part within the space between the first PCB and the second PCB.

3. The circuit interconnect of claim 1, wherein:
   one of the first PCB and the second PCB includes a rigid PCB, and
   another of the first PCB and the second PCB includes a flexible PCB.

4. The circuit interconnect of claim 1, wherein the first electrically conductive pad is a fine-pitch pad and the second electrically conductive pad is a fine-pitch pad.

5. The circuit interconnect of claim 1, wherein the first electrically conductive pad has a diameter equal to or less than 0.28 millimeters (mm) and the second electrically conductive pad has a diameter equal to or less than 0.28 mm.

6. The circuit interconnect of claim 1, wherein the first PCB further includes a third electrically conductive pad, and a distance from a center of the first electrically conductive pad and a center of the third electrically conductive pad is equal to or less than 0.7 millimeters.

7. A rigid-flex circuit including a rigid-flex interconnect comprising:
   a flexible printed circuit board (PCB) including:
      a first plurality of electrically conductive pads; and
      a first plurality of spacers consisting of a first plurality of electrically conductive plates covered by a first dielectric layer;
   a rigid PCB including:
      a second plurality of electrically conductive pads;
      a second plurality of spacers consisting of a second plurality of electrically conductive plates covered by a second dielectric layer; and
   a plurality of electrically conductive solder joints conductively connecting the first plurality of electrically conductive pads and the second plurality of electrically conductive pads,
   the first plurality of spacers positioned to abut the second plurality of spacers as the first plurality of electrically conductive pads and the second plurality of electrically conductive pads are conductively connected during a soldering process such that a space remains between the flexible PCB and the rigid PCB after the first plurality of electrically conductive pads and the second plurality of electrically conductive pads are conductively connected as a result of the soldering process, wherein the first plurality of spacers and the second plurality of spacers each have a height equivalent to one-half the height of the space that remains between the flexible PCB and the rigid PCB.

8. The rigid-flex circuit of claim 7, further comprising a dielectric support located at least in part within the space between the flexible PCB and the rigid PCB.

9. The rigid-flex circuit of claim 7, wherein each electrically conductive pad of the first plurality of electrically conductive pads and each electrically conductive pad of the second plurality of electrically conductive pads are fine-pitch pads.

10. The rigid-flex circuit of claim 7, wherein each electrically conductive pad of the first plurality of electrically conductive pads and each electrically conductive pad of the second plurality of electrically conductive pads have a diameter equal to or less than 0.28 millimeters.

11. The rigid-flex circuit of claim 7, wherein a distance from a center of a first electrically conductive pad of the first plurality of electrically conductive pads and a center of a second electrically conductive pad of the first plurality of electrically conductive pads is equal to or less than 0.7 millimeters.

* * * * *